United States Patent
Moriyama

[11] Patent Number: 6,143,991
[45] Date of Patent: *Nov. 7, 2000

[54] BUMP ELECTRODE WITH ADJACENT PAD AND INSULATION FOR SOLDER FLOW STOPPING

[75] Inventor: Yoshifumi Moriyama, Tokyo, Japan

[73] Assignee: NEC Corporation, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/653,781

[22] Filed: May 28, 1996

[30] Foreign Application Priority Data

May 26, 1995 [JP] Japan ................ 7-152298

[51] Int. Cl.⁷ .................................................. H01R 9/09
[52] U.S. Cl. ...................... 174/261; 361/768; 174/260
[58] Field of Search ................ 257/737, 778, 257/781, 750, 779, 766, 741; 174/260, 257, 261, 250; 361/771, 767, 768, 772, 773, 777, 769, 774; 228/180.21, 180.22

[56] References Cited

U.S. PATENT DOCUMENTS

| | | | |
|---|---|---|---|
| 3,780,352 | 12/1973 | Redwanz | 361/792 |
| 5,245,750 | 9/1993 | Crumly et al. | 29/840 |
| 5,279,711 | 1/1994 | Frankeny et al. | 174/263 |
| 5,345,365 | 9/1994 | Herndon et al. | 361/760 |
| 5,432,679 | 7/1995 | Grabbe | 361/769 |
| 5,438,478 | 8/1995 | Kondo et al. | 361/704 |
| 5,467,253 | 11/1995 | Heckman et al. | 361/761 |
| 5,523,920 | 6/1996 | Machuga et al. | 367/767 |
| 5,790,377 | 8/1998 | Schreiber et al. | 361/704 |
| 5,864,946 | 2/1999 | Eldridge et al. | 29/843 |

FOREIGN PATENT DOCUMENTS 61-174752 8/1986 Japan.

Primary Examiner—Jeffrey Gaffin
Assistant Examiner—Kamand Cuneo
Attorney, Agent, or Firm—Sughrue, Mion, Zinn, Macpeak & Seas, PLLC

[57] ABSTRACT

A connection electrode structure includes a wiring conductor layer formed on a printed wiring board, a bump electrode portion formed on an outer end portion of the wiring conductor layer and formed by an electroplating of Cu, a pad electrode portion formed inwardly adjacent to the bump electrode portion and continuous with it, a Ni/Au layer covering the bump electrode portion and the pad electrode portion, and a solder resist layer formed on a portion of the wiring conductor layer at an inside of the pad electrode portion to stop solder flow.

7 Claims, 12 Drawing Sheets

BUMP ELECTRODE WITH ADJACENT PAD AND INSULATION FOR SOLDER FLOW STOPPING

BACKGROUND OF THE INVENTION

1. Field of the Invention

The present invention relates to a bump electrode structure and a method for forming the same, and more specifically to a bump electrode structure formed on a printed wiring board for solder-connection, and a method for forming the same.

2. Description of Related Art

A typical example of a conventional bump electrode formed on a printed wiring board for solder-connection, is so configured that, as shown in FIG. 1, in a glass-epoxy board 16 having a semiconductor device chip 15 which is die-bonded within a recess formed in one surface of the glass-epoxy board 16 and which is connected to patterned wiring conductors 13A through connection wires, the chip and the connection wires being encapsulated by a resin 14, electrode lands are formed on the other surface of the glass-epoxy board 16 in which the chip is not located, and a predetermined amount of solder is piled on each electrode land so as to form a solder bump 13 (See Japanese Patent Application Laid-Open Publication No. JP-A-61-174752 or English Abstract thereof, the disclosure of which are incorporated by reference in its entirety into this application). The solder forming the solder bumps 13 is supplied by, for example, a solder dip process, a solder paste printing process, or a method using a solder ball electrode, typified by a ball grid array (abbreviated "BGA").

In the case of mounting a package having solder ball electrodes, on a printed wiring board, in order to realize a reliable mounting and to obtain a desired degree of connection reliability, it has been considered to be required that an electrode size is on the order of 0.6 to 1.0 mm, and an electrode pitch is on the order of 1.27 to 1.5 mm.

On the other hand, as a conventional method for utilizing a connecting bump electrode formed by an electroplating, a TAB (Tape Automated Bonding) process has been known. Referring to FIG. 2, there is shown a sectional view illustrating this second conventional example.

In the second conventional example, as shown in FIG. 2, a film lead 21 formed on an insulating film 17 and having a bump electrode 18 formed at a tip end thereof is connected to a semiconductor device chip 15A located on a heating stage 20, with the intermediary of the bump electrode 18, by action of a pulse-heated tool 19. The bump electrode 18 is formed by piling, for example, copper, nickel, cold or the like. Since the connection is realized by a eutectic bonding by the pulse-heated tool 19, a satisfactory connection can be obtained if the height of the bump electrode is on the order of 20 μm.

However, in packaging by using the conventional bump electrodes as mentioned above, the following disadvantages have been encountered:

In the case of the solder connecting, in order to avoid a defective connection such as a short-circuiting caused by a solder reflowing, and in order to ensure a reliability after the connection has been made, the electrode pitch is required to be at least on the order of 1.27 to 1.5 mm, as mentioned hereinbefore. This is a large restriction in reducing the size of the package and in increasing the number of external terminals.

In the conventional bump electrode formed by the electroplating, on the other hand, the structure is not so made to have a sufficient electrode height, and therefore, this bump electrode cannot be applied to a solder packaging. On the other hand, it inevitably needs a tool, such as the heating tool, which is not required in the solder packaging.

SUMMARY OF THE INVENTION

Accordingly, it is an object of the present invention to provide a structure of a bump electrode and a method for forming the same, which has overcome the above mentioned defects of the conventional ones.

Another object of the present invention is to provide a structure of a bump electrode capable of preventing a short-circuiting from occurring at the time of a packaging, reducing the electrode pitch so as to increase the number of electrodes, and having a high connection reliability, and a method for forming the same.

The above and other objects of the present invention are achieved in accordance with the present invention by a connection electrode structure comprising a wiring conductor layer formed on a printed wiring board, a bump electrode portion formed on an outer end portion of the wiring conductor layer and formed of a metal having a solidifying or softening temperature sufficiently higher than a reflow temperature of a solder used for a solder connection, a coating metal layer covering the bump electrode portion and having a solder wettability, a pad electrode portion formed continuously and adjacent to the bump electrode portion, and an insulating layer formed on a portion of the wiring conductor layer at an inner side of the bump electrode portion.

In an embodiment of the connection electrode structure, the pad electrode portion is formed of a portion of the wiring conductor layer between the bump electrode portion and the insulating layer. Alternatively, the pad electrode portion completely surrounds the bump electrode portion, and continues to the wiring conductor layer. Preferably, the insulating layer is formed of a solder resist.

In a preferred embodiment, the bump electrode portion is formed of an electroplated metal layer, and has a height of not less than 30 μm, preferably not less than 100 μm. In addition, more preferably, the bump electrode portion is formed of an electroplated Cu layer and the coating metal layer is formed of an Ni/Au conducting layer.

According to another aspect of the present invention, there is provided a method for forming a connection electrode structure, comprising the steps of:

forming on a wiring board a patterned wiring conductor layer having a center region and a plurality of wiring conductors and at least one electroplating lead-out conductor extending outward from the center region;

selectively forming a bump electrode portion having a substantial height on an outer end portion of each of the wiring conductors by an electroplating of a metal while supplying an electroplating current through the at least one electroplating lead-out conductor, the metal having a solidifying or softening temperature sufficiently higher than a reflow temperature of a solder used for a solder connection;

forming a coating metal layer to cover at least the bump electrode portion, the coating metal layer having a solder wettability; and selectively removing the center region of the patterned wiring conductor layer and forming a recess in a central region of the wiring board, so that the wiring conductors are separated from one another and from the at least one electroplating lead-out conductor, and has the bump electrode portion formed on the outer end portion thereof.

With the above mentioned construction of the connection electrode, the electrode structure in accordance with the present invention is characterized in that a bump electrode is composed of a bump electrode portion and a pad electrode portion adjacent to the bump electrode portion, the bump electrode having a sufficient height as compared with the pad electrode portion and being formed of a metal having a solidifying or softening temperature sufficiently higher than a reflow temperature of a solder used for a solder connection. In the process of solder-connecting by a reflow of a printed solder paste, it is possible to avoid inconveniences such as a short-circuiting caused by a reflowed solder, since a solder paste pressed out from a parts supporting electrode will climb up along a side surface of the bump electrode to the pad electrode portion. Therefore, it is also possible to reduce the electrode pitch. For example, it is possible to realize a package having a narrow electrode pitch of not greater than 1 mm, for example, of 0.8 mm or 0.65 mm. This is very effective in increasing the number of electrodes.

In addition, according to the present invention, after completion of the solder connection, the solder connection is realized in such a condition that the bump electrode portion has been fitted in the solidified solder, since the solder paste pressed out from the parts supporting electrode has climbed up along a side surface of the bump electrode to the pad electrode portion. Accordingly, the strength of the solder connection is elevated, and the connection reliability is remarkably increased. In particular, when a bump electrode structure is composed of a bump electrode portion surrounded by a pad electrode portion having a thickness sufficiently smaller than the height of the bump electrode portion, it is possible to reduce the amount of solder paste swollen out of the contour of a parts supporting electrode, so that possibility of a short-circuiting caused by the reflowed solder can be minimized, and therefore, the connection reliability can be greatly improved.

According to the present invention, the bump electrode portion adjacent to or surrounded by the pad electrode portion can be formed by selectively forming a thick metal layer by an electroplating. Therefore, it is possible to easily form the bump electrode portion of a metal having a solidifying or softening temperature sufficiently higher than a reflow temperature of a solder used for a solder connection. In addition, it is also possible to minimize variation of the height of the bumps.

The above and other objects, features and advantages of the present invention will be apparent from the following description of preferred embodiments of the invention with reference to the accompanying drawings.

DESCRIPTION OF THE PREFERRED EMBODIMENTS

Embodiment 1

A first embodiment of the bump electrode structure in accordance with the present invention will be described with reference to FIGS. 3A, 3B, 4 and 5.

Figure 3A:
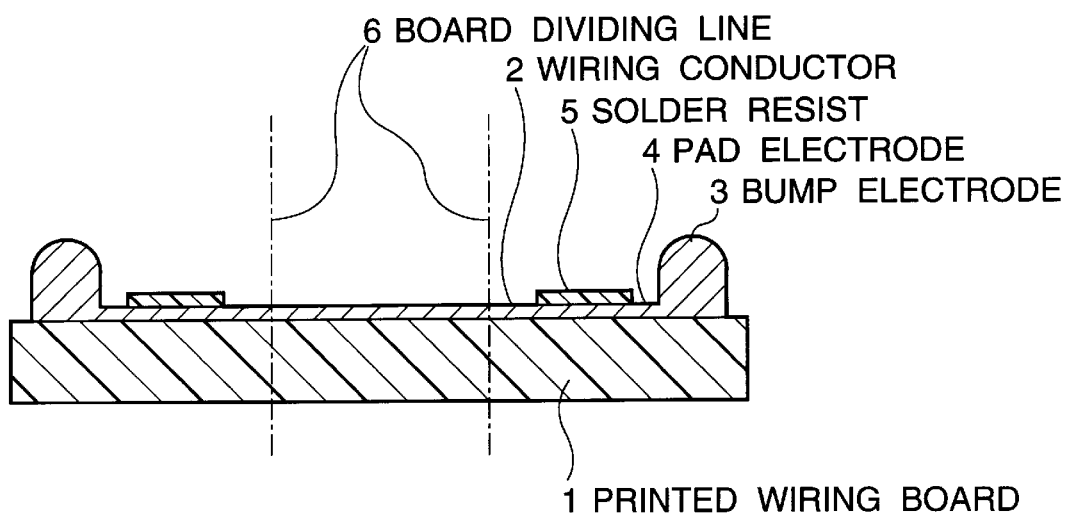
FIGS. 3A and 3B are diagrammatic sectional views illustrating a process for forming a first embodiment of the bump electrode structure in accordance with the present invention.
Figure 3B:
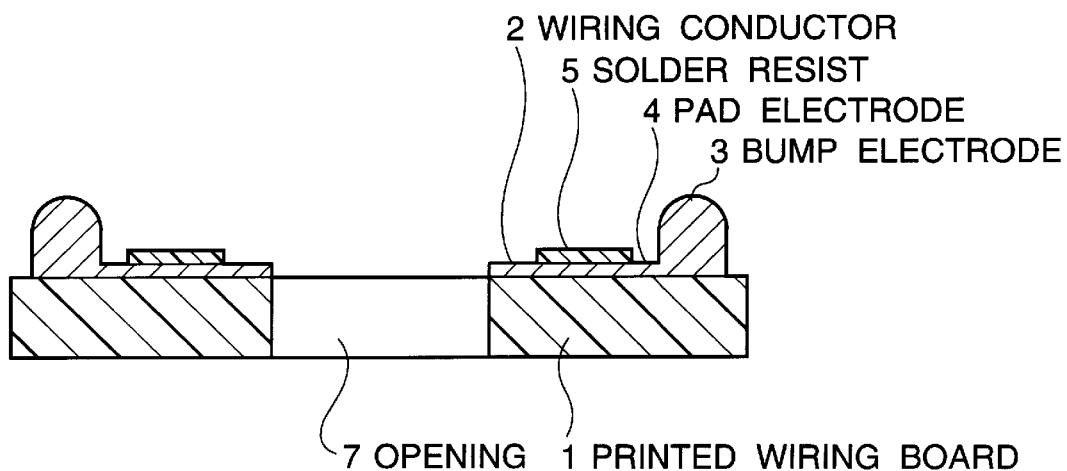
Figure 4:
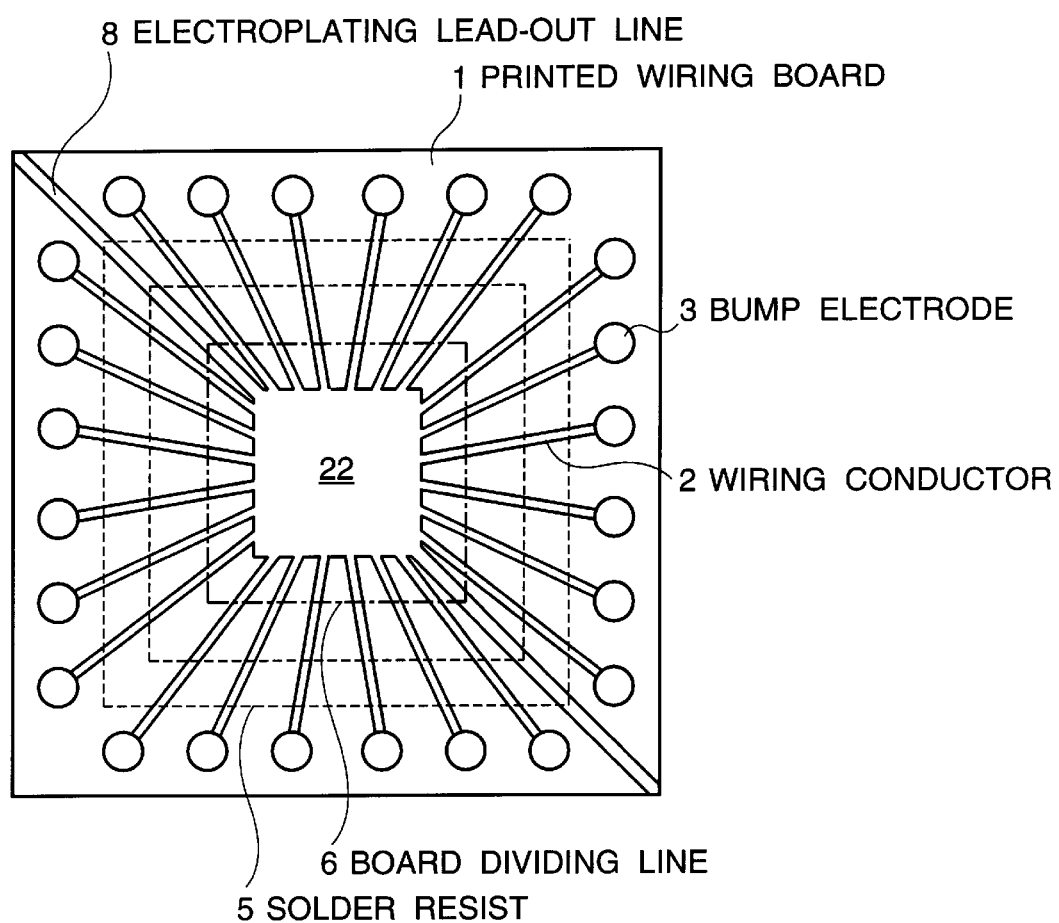
FIG. 4 is a plan view of the electrode structure in the condition shown in FIG. 3A.

As shown in FIGS. 3A and 4, a number of patterned wiring conductors 2 are formed on a printed wiring board 1 to extend radially outward from a square center region 22. Additionally, a pair of electroplating lead-out conductors 8 extends orthogonally from the square center region 22. A bump electrode portion 3 is formed on an outer tip end of each wiring conductor 2, and a pad electrode portion 4 is formed at a portion of the wiring conductor 2 at an inner side of the bump electrode portion 3. Furthermore, a solder resist 5 is formed on a position of the wiring conductor 2 inwardly apart from the bump electrode portion 3 by a small distance so that the bump electrode portion 3 and the pad electrode portion 4 are located at an outer side of the solder resist 5. This solder resist 5 has less solder wettability.

The wiring conductors 2 and the electroplating lead-out conductors 8 can be formed by patterning a metal sheet adhered on the printed wiring board 1, for example, an etching or another. Each bump electrode portion 3 can be formed by covering each wiring conductor 2 other than the outer tip end thereof with a thick electroplating resist such as a dry film resist, and by performing a copper electroplating using the electroplating lead-out conductors 8 as an electroplating current supply path. For example, the bump electrode portions 3 are formed to have a height of not less than 30 $\mu$m. More preferably, the bump electrode portions 3 are formed to have a height of not less than 100 $\mu$m, because a satisfactory and stable solder connection can be easily obtained with a current solder reflow technology.

Figure 1:
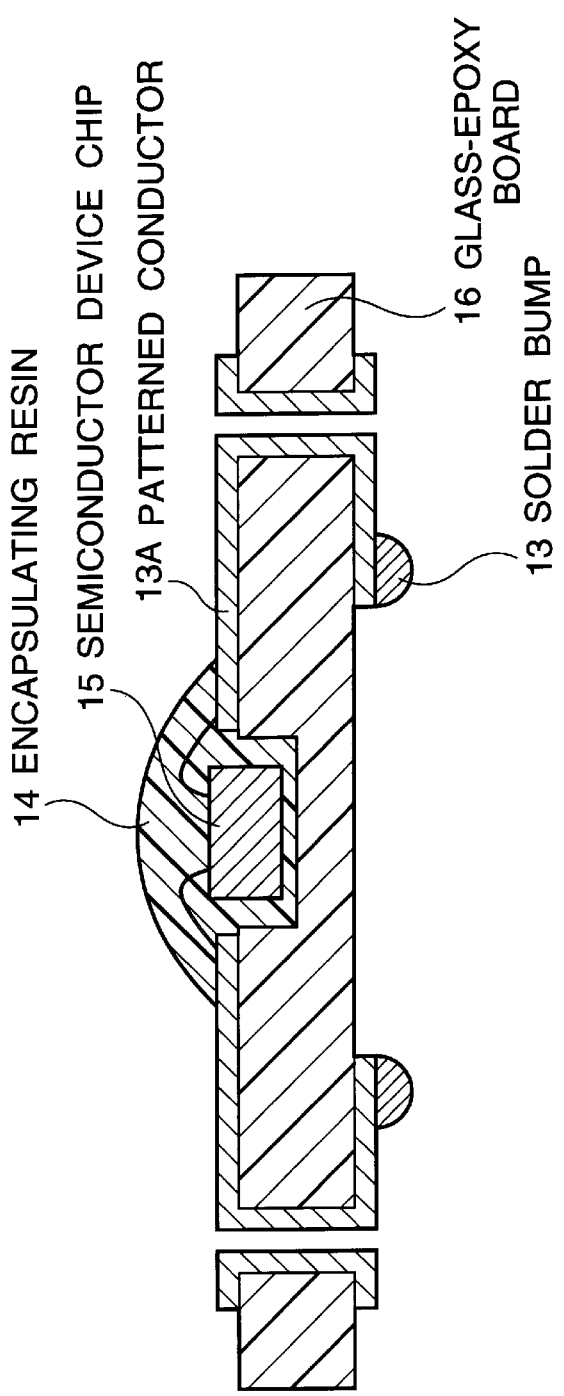
FIG. 1 is a diagrammatic sectional view illustrating a first example of a conventional bump electrode formed on a printed wiring board for solder-connection.
Figure 2:
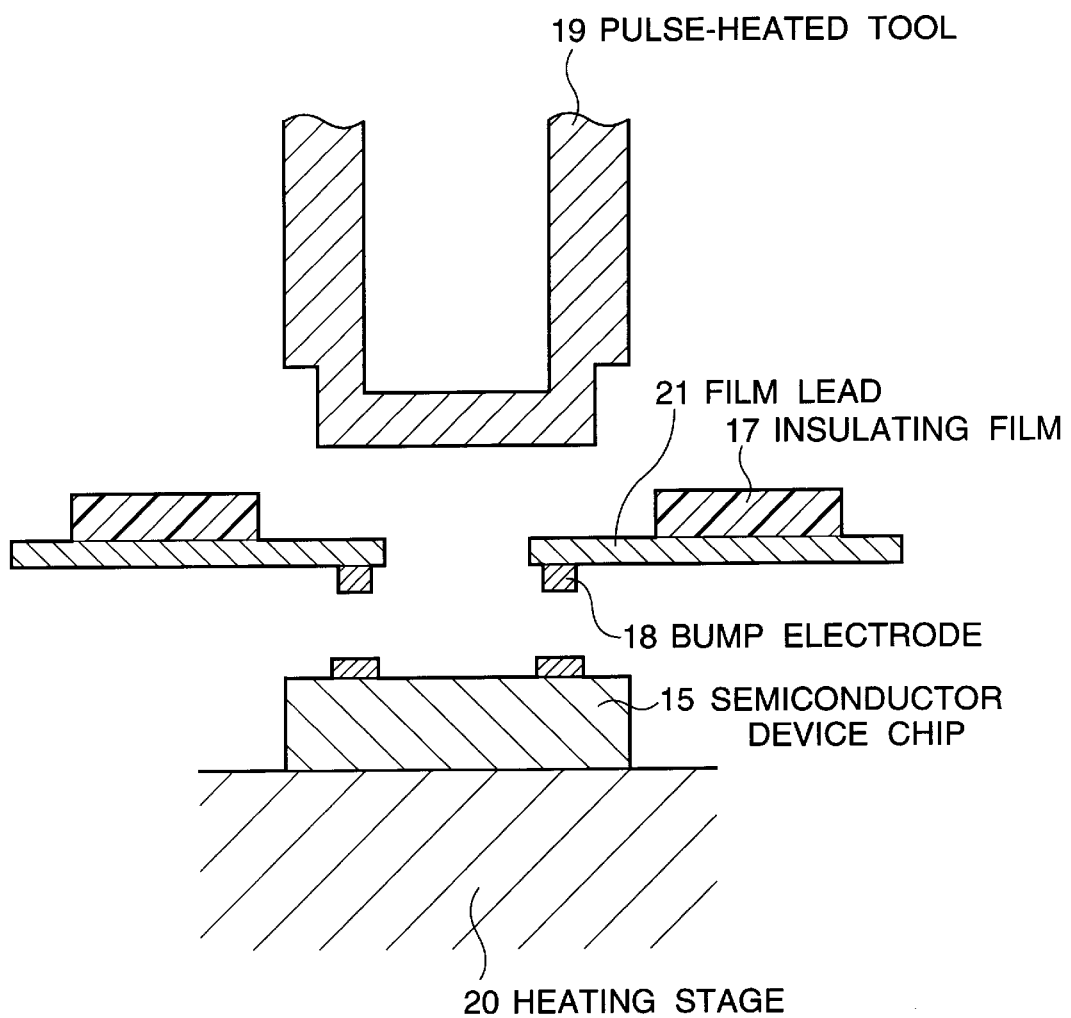
FIG. 2 is a diagrammatic sectional view illustrating a second example of a conventional bump electrode formed by an electroplating.
Figure 5:
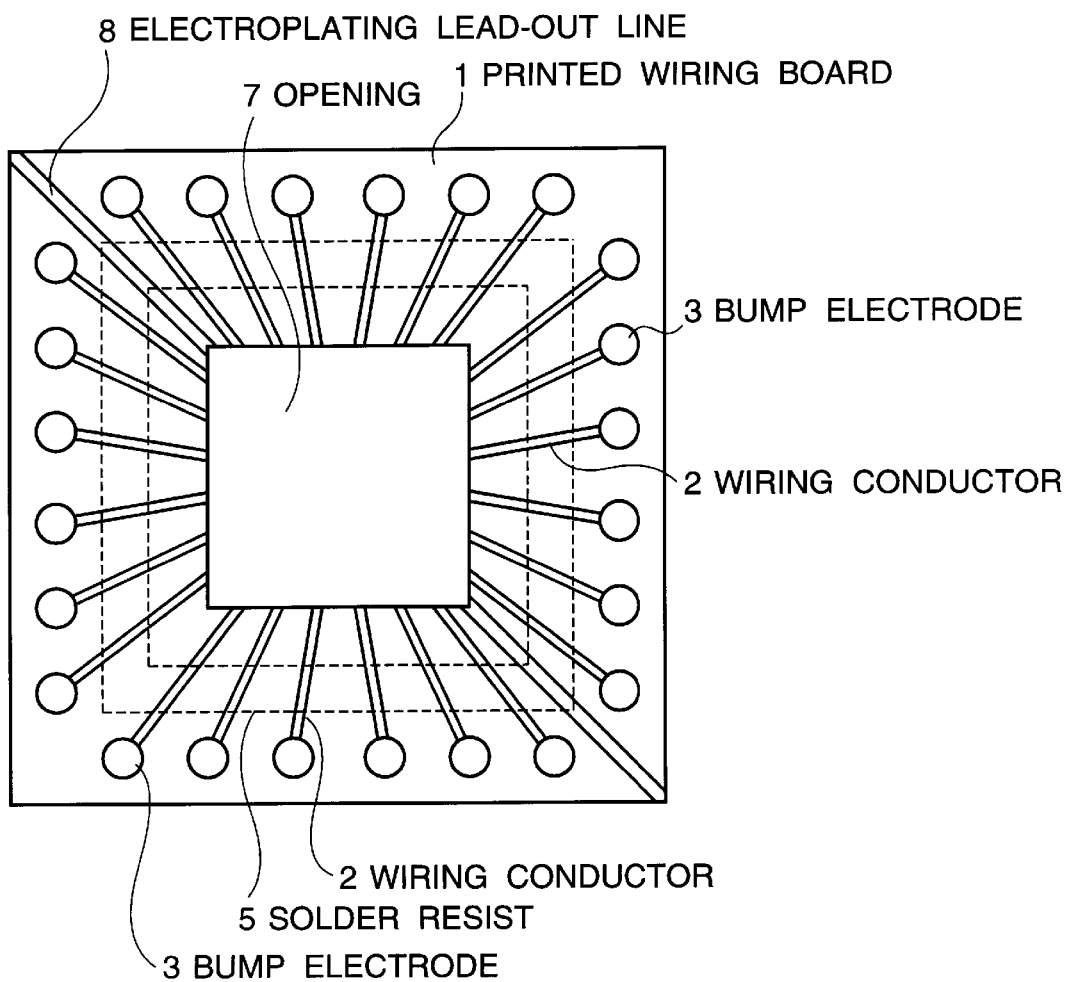
FIG. 5 is a plan view of the electrode structure in the condition shown in FIG. 3B.

The printed wiring board 1 is cut out along a board dividing line 6 shown in FIGS. 3A and 4, so that, as shown in FIGS. 4A and 5, an opening 7 is formed to separate the wiring conductors 2 from one another and from the electroplating lead-out conductors 8. A semiconductor device chip (not shown) similar to the chip 15 shown in FIG. 1 is located within the opening 7, and external electrodes (not shown) of the not-shown chip are wire-bonded to an inner end of the wiring conductors 2.

For formation of the opening 7 in the printed wiring board 1, it is a general practice to use a metal die, but it is possible to use a router. Alternatively, a counter-boring can be made to the printed wiring board 1 to remove a center portion of each of the patterned conductors and the printed wiring board so that a recess corresponding to the opening 7 is formed in the printed wiring board.

Figure 6:
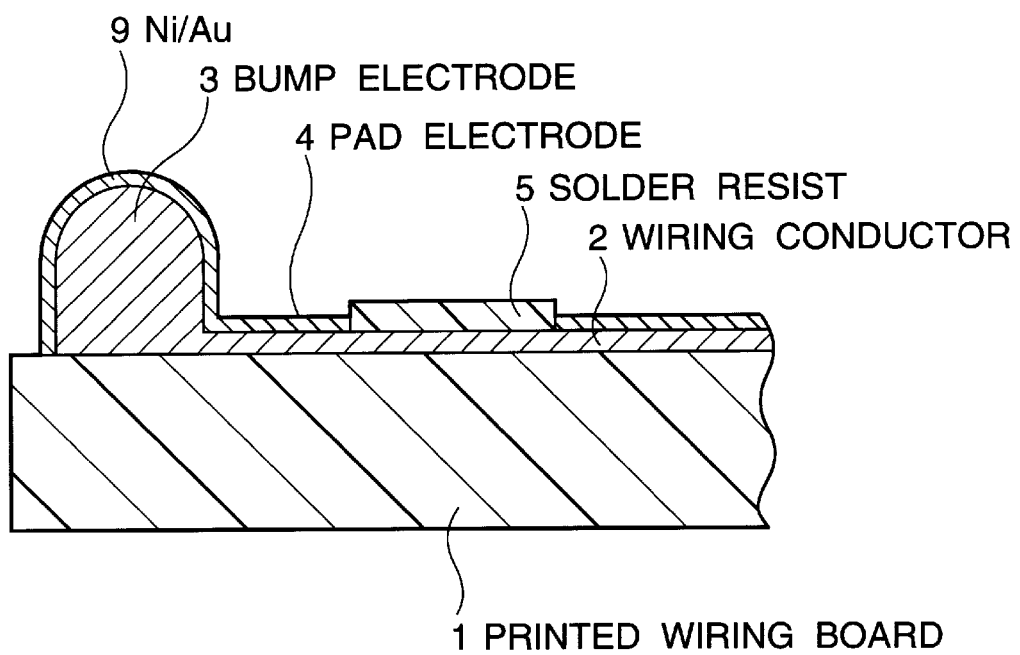
FIG. 6 is an enlarged sectional view of a bump electrode portion in the first embodiment of the bump electrode structure in accordance with the present invention.
Figure 7:
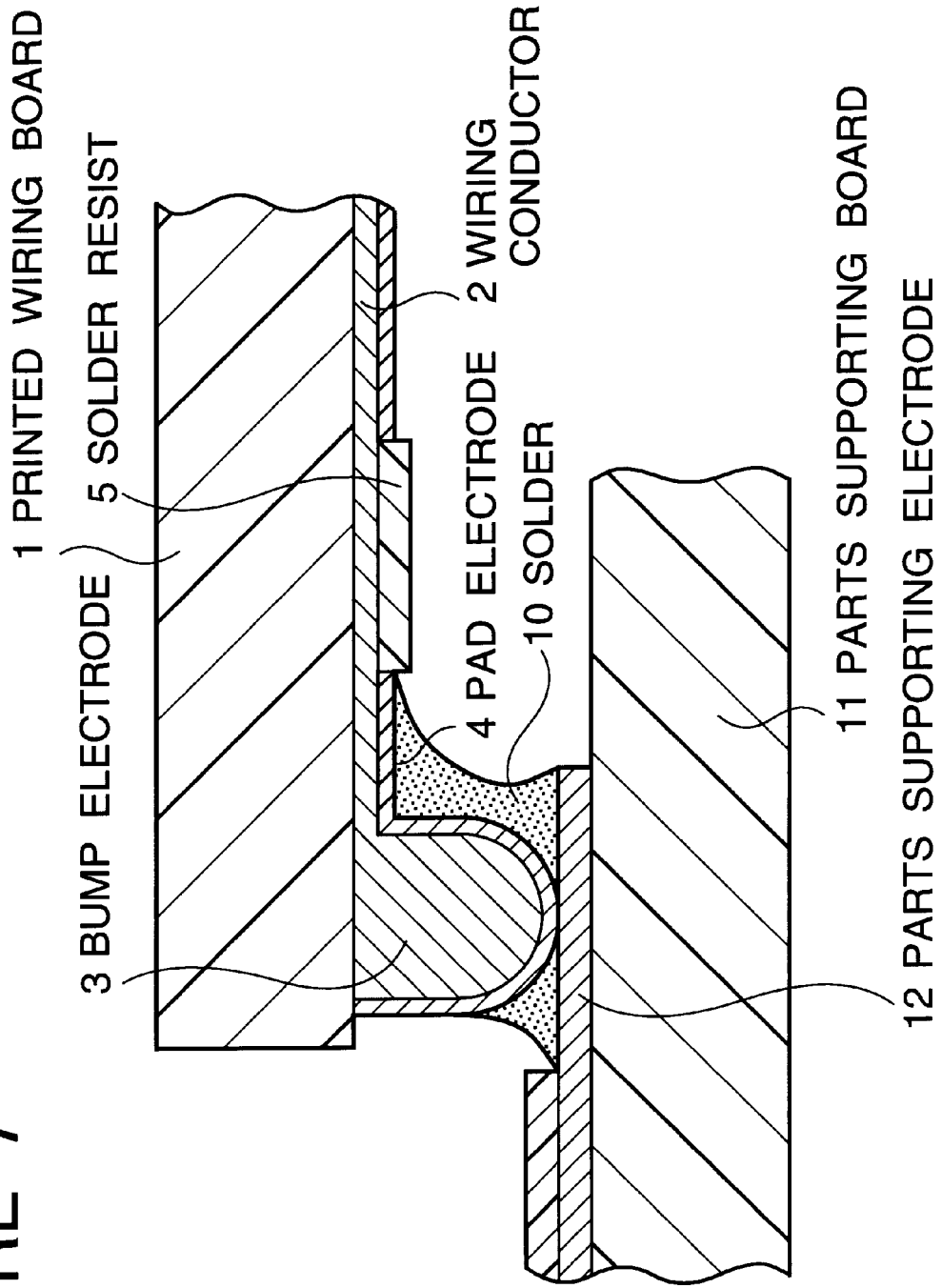
FIG. 7 is an enlarged sectional view of the bump electrode portion, in a packaged condition, of the first embodiment of the bump electrode structure in accordance with the present invention.

Referring to FIG. 6, there is shown an enlarged sectional view of a bump electrode portion in the first embodiment of the bump electrode structure in accordance with the present invention. As shown in FIG. 6, a surface of the bump electrode portion 3 and a surface of the wiring conductor 2 excluding the solder resist 5 is coated with a Ni/Au conducting layer 9, which prevents oxidation of the bump electrode portion 3 and the wiring conductor 2 and which gives a good and stable solder-wettability In assembling, as shown in FIG. 7, which is an enlarged sectional view of the bump electrode portion, in a packaged condition, of the first embodiment of the bump electrode structure in accordance with the present invention, a solder paste is applied on a parts supporting electrode 12 formed on a parts supporting board 11, and the printed wiring board 1 is located above the parts supporting board 11 in such a manner that each bump electrode 3 is in contact with the solder pasts applied on a corresponding parts supporting electrode 12. Thereafter, a reflow is carried out, with the result that each bump electrode 3 is bonded and connected to the corresponding parts supporting electrode 12 by a solder 10.

As shown in FIG. 7, when the bump electrode portion is connected by the solder 10, of the solder applied to the parts supporting electrode 12, an excessive part pressed out from an interface between the bump electrode portion 3 and the parts supporting electrode 12, climbs up along a side surface of the bump electrode portion 3 to the pad electrode portion 4, but is blocked by the solder resist 5. As a result, after the solder 10 is solidified, the bump electrode portion 3 is fitted in the solidified solder 10. Namely, an increased connection strength can be obtained.

In an ordinary practice for mounting a SMT (surface mount technology) part, a thickness of a printed solder paste is on the order of 100 µm to 250 µm. Therefore, assuming that the thickness of the solder paste printed on the parts supporting electrode 12 is for example 150 µm, and the height of the bump electrode portion 3 is 200 µm, if it is designed that a width of the bump electrode portion 3 and the pad electrode portion 4 is about 300 µm, even if the electrode pitch is designed to be 0.65 mm, it is possible to realize an excellent connection in which no short-circuiting occurs.

Embodiment 2

Figure 8:
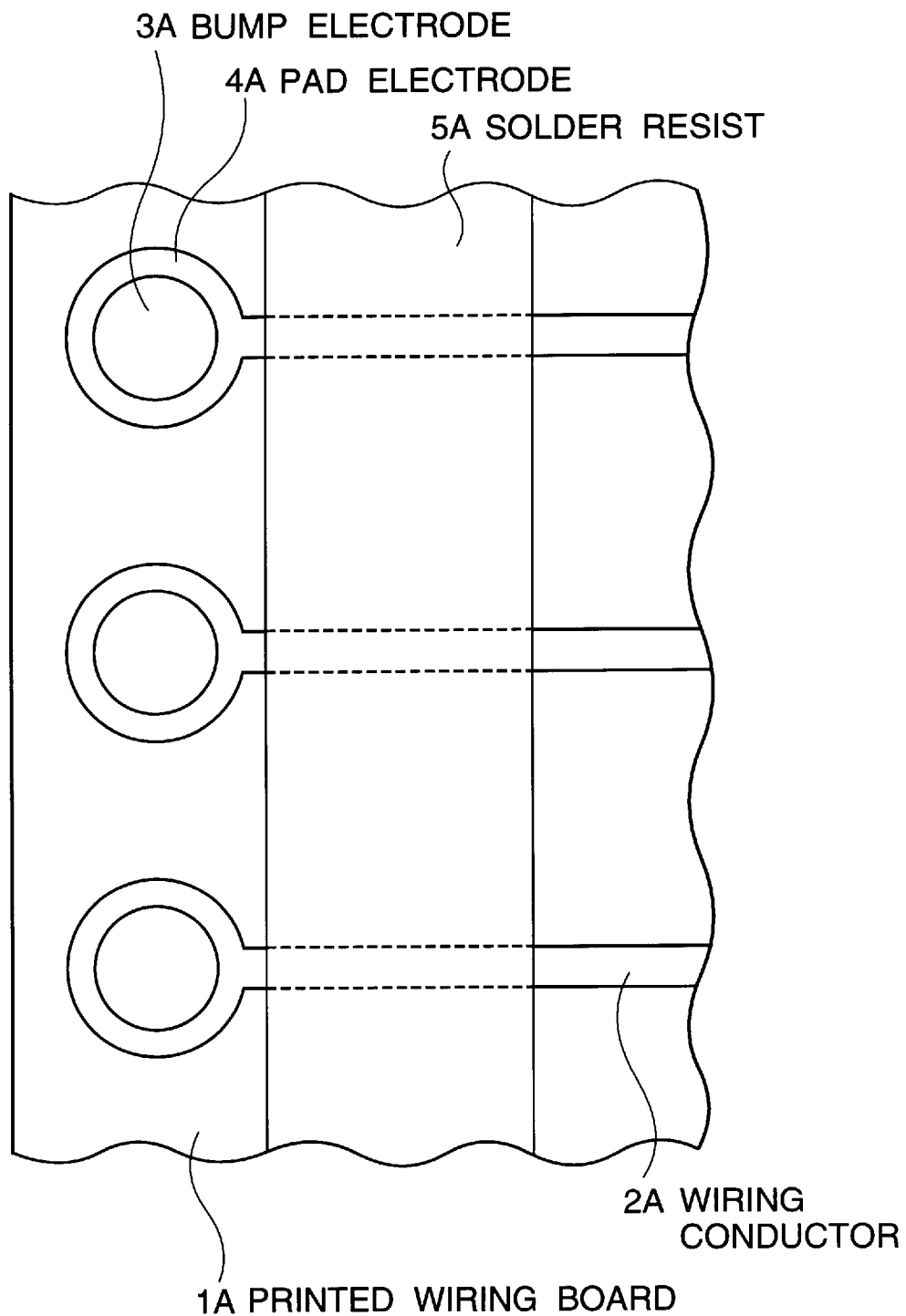
FIG. 8 is a partial enlarged plan view of a second embodiment of the bump electrode structure in accordance with the present invention.
Figure 9:
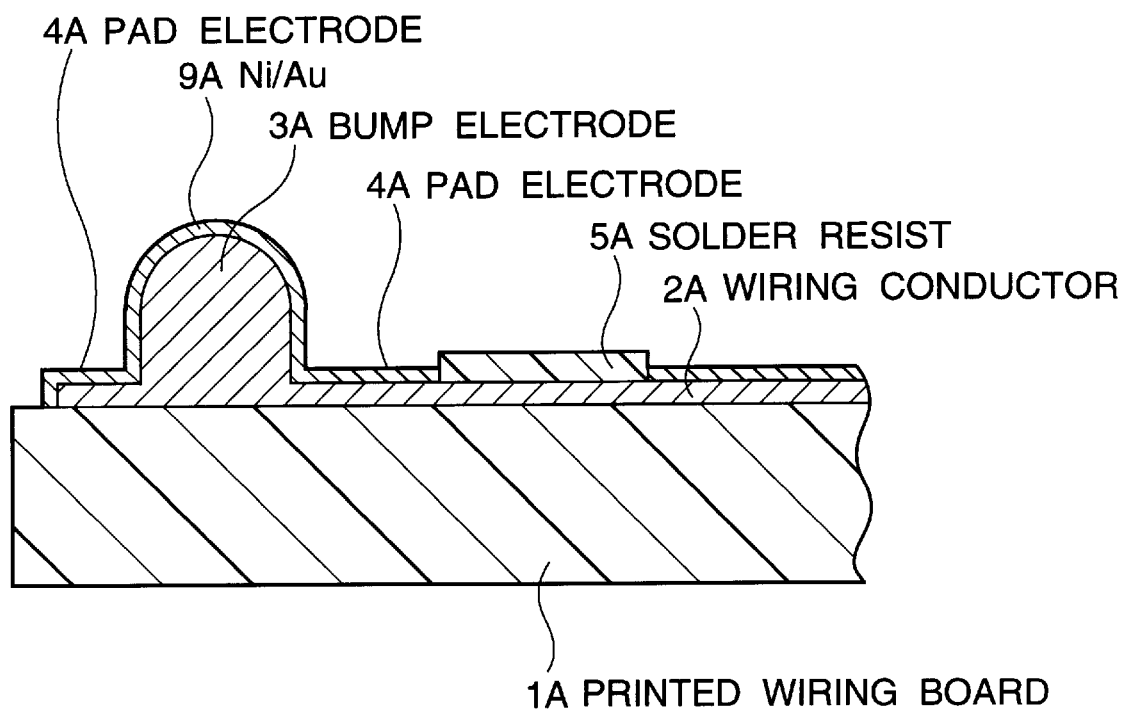
FIG. 9 is a partial enlarged sectional view of the second embodiment of the bump electrode structure in accordance with the present invention.

A second embodiment of the bump electrode structure in accordance with the present invention will be described with reference to FIGS. 8, 9 and 10, which are a partial enlarged plan view and a partial enlarged sectional view of the second embodiment and a partial enlarged sectional view of the second embodiment in a packaged condition, respectively.

In the second embodiment, wiring conductors 2A are formed on a printed wiring board 1A, and a circular pad electrode portion 4A is formed at an outer tip end of each wiring conductor 2A. A bump electrode portion 3A is formed on a center portion of the circular pad electrode portion 4A so that the bump electrode portion 3A is completely surrounded by the pad electrode portion 4A.

A solder resist 5A having less solder wettability is formed on a position of the wiring conductor 2A inwardly apart from the pad electrode portion 4A by a small distance so that the bump electrode portion 3A and the pad electrode portion 4A are located at an outer side of the solder resist 5A. A surface of the bump electrode portion 3A and a surface of the wiring conductor 2A excluding the solder resist 5A is coated with a Ni/Au conducting layer 9A, which prevents oxidation of the bump electrode portion 3A and the wiring conductor 2A and which gives a good and stable solder-wettability.

Figure 10:
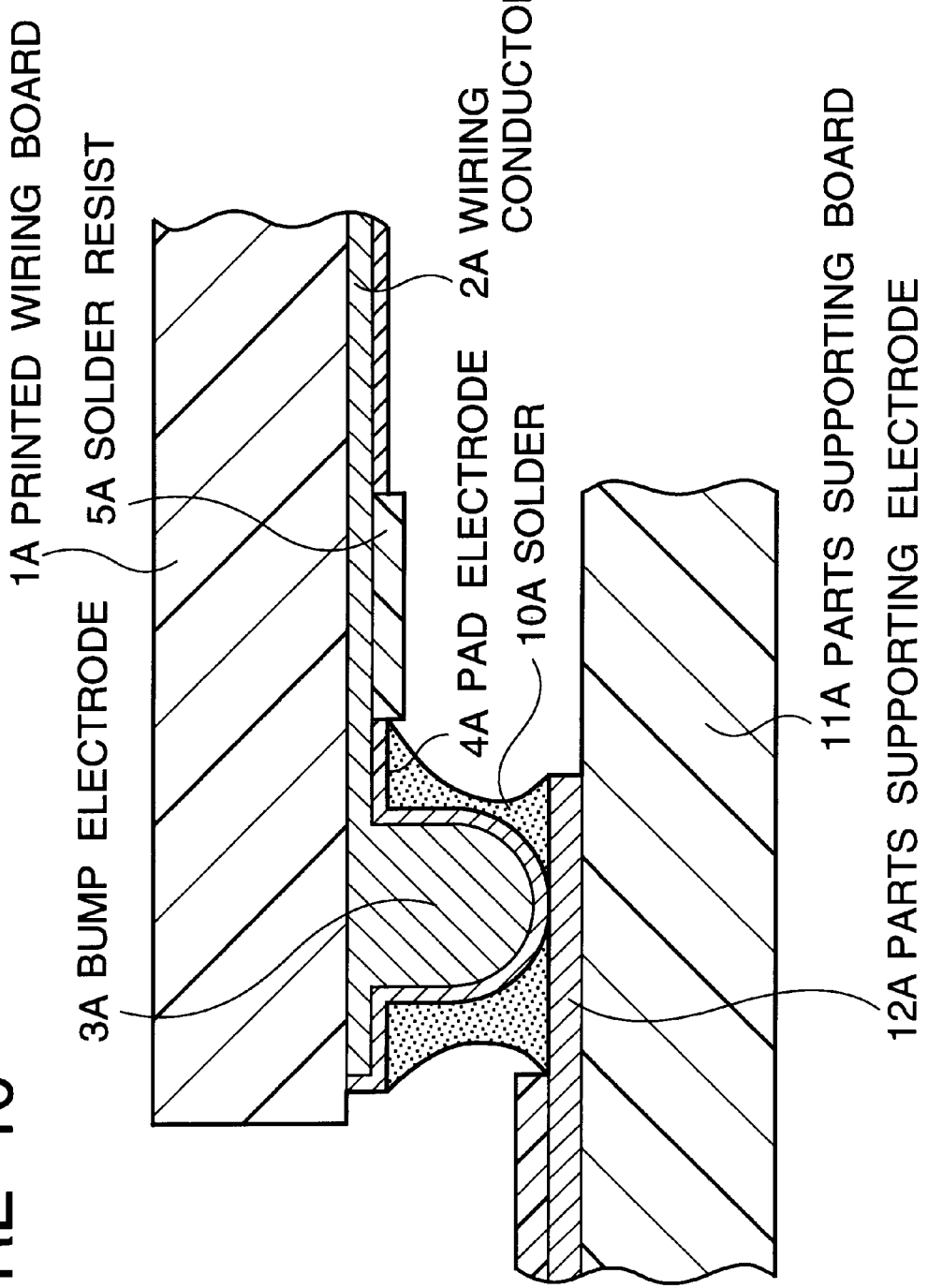
FIG. 10 is a partial enlarged sectional view of the second embodiment of the bump electrode structure in accordance with the present invention in a packaged condition.

In the second embodiment, since the bump electrode portion 3A is completely surrounded by the pad electrode portion 4A, it becomes difficult to reduce the electrode pitch, but since it is so designed that a solder climbs up from a full periphery of the bump electrode portion, even if a some degree of positional deviation occurs between the bump electrode portion 3A and a parts supporting electrode 12A formed on a part supporting board 11A in the condition shown in FIG. 10, it is possible to form such a condition that, after a solder 10A is solidified, the bump electrode portion 3A has been fitted in the solidified solder 10A. Namely, an increased connection strength can be obtained, similarly to the first embodiment.

In the above mentioned embodiments, the bump electrode portion and the pad electrode portion can be in an arbitrary shape including a circle, an ellipse, a square, and a rectangle. However, if these electrodes are in the form of a circle or in the form close to the circle, these electrodes can be easily located in the form of a grid on the printed wiring board.

Figure 11:
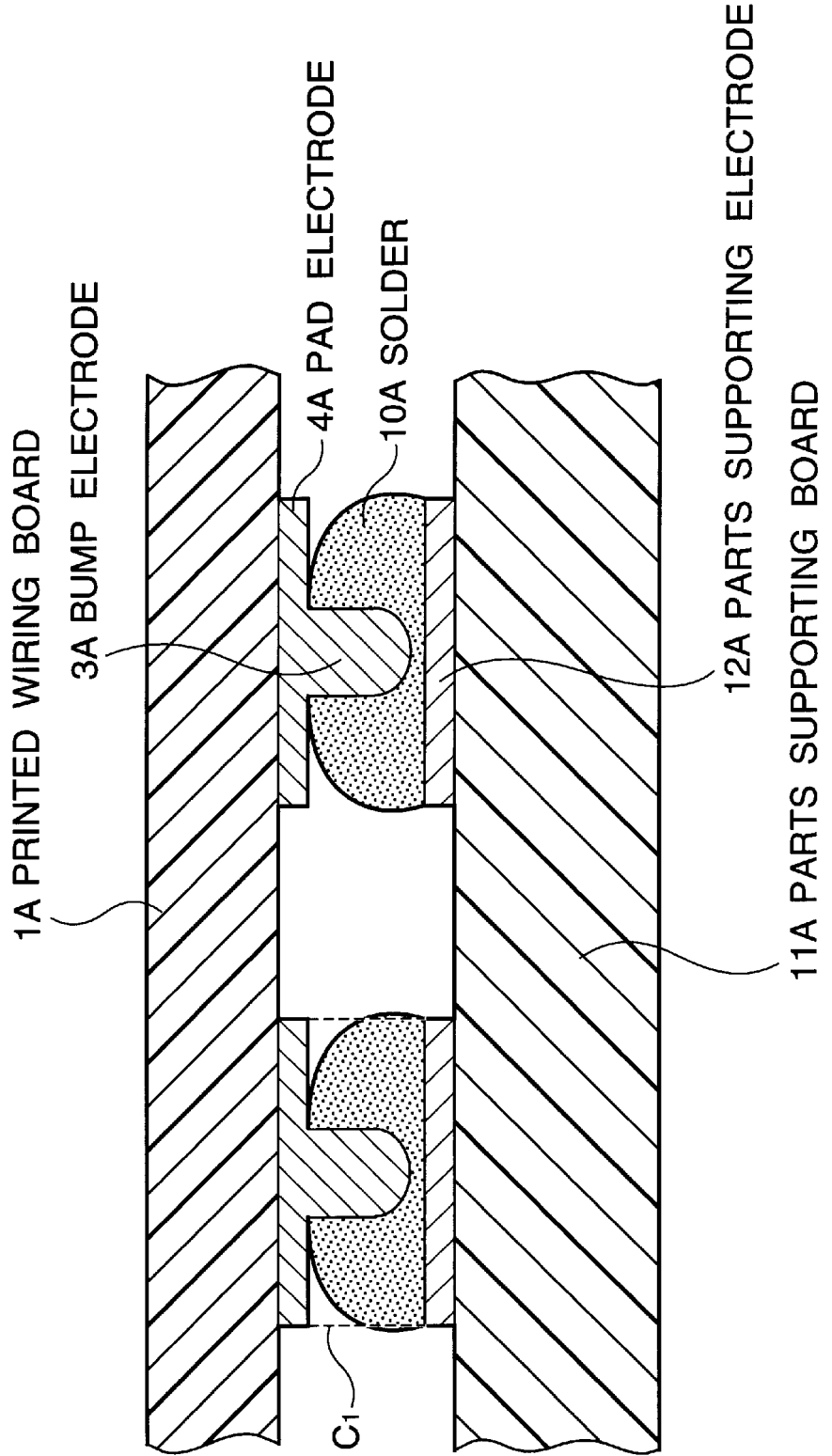
FIG. 11 is a partial enlarged sectional view illustrating a solder connection in the case that a bump electrode portion is surrounded by a pad electrode portion in accordance with the present invention.
Figure 12:
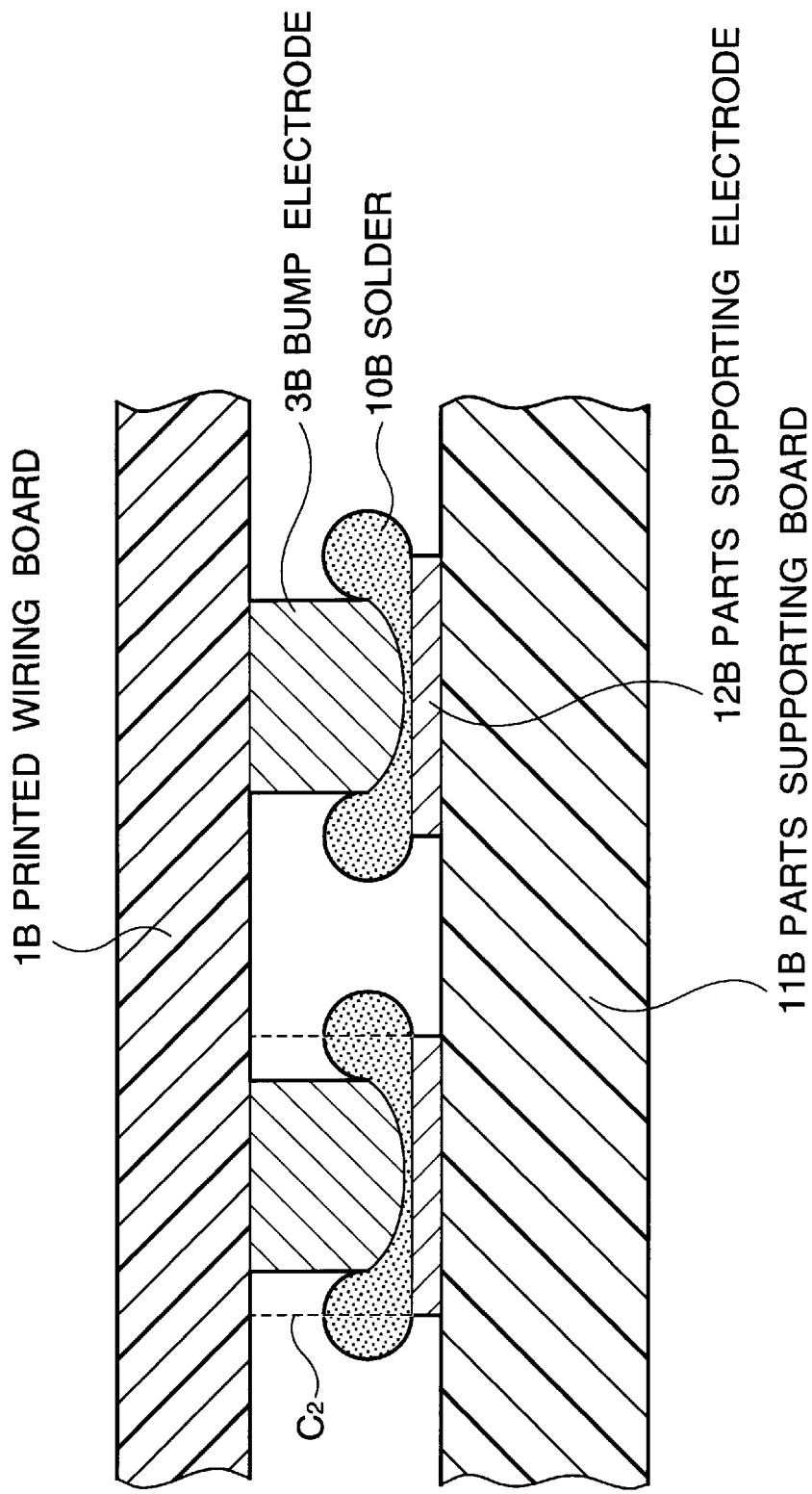
FIG. 12 is a partial enlarged sectional view illustrating a solder connection in the case that a bump electrode portion is not surrounded by a pad electrode portion.

Referring to FIG. 11, there is shown a partial enlarged sectional view illustrating a solder connection in the case that a bump electrode portion is surrounded by a pad electrode portion, when a board having bump electrode portions is mounted on a parts supporting board on which a solder paste is printed. FIG. 12 is a partial enlarged sectional view illustrating a solder connection in the case that a bump electrode portion is not surrounded by a pad electrode portion.

As shown in FIG. 11, if each electrode is constituted of the bump electrode portion 3A surrounded by the pad electrode portion 4A, it is possible to greatly reduce the amount of the solder 10A swollen out of a contour "$C_1$" of the parts supporting electrode 12A, in comparison with the case in which, as shown in FIG. 12, a bump electrode portion 3B is not surrounded by a pad electrode portion and therefore, a relatively large amount of solder 10B is swollen out of a contour "$C_2$" of a parts supporting electrode 12B. Accordingly, it is possible to remarkably reduce generation of short-circuiting at the time of a reflowing.

In addition, it is also possible to reduce the electrode pitch, and to easily increase the number of electrodes of a package.

In the above mentioned embodiments, the bump electrode portions 3 and 3A are formed of copper (Cu) by the electroplating, but can be formed of other metals, such as Ni or Cu, or alloy, which has a solidifying or softening temperature sufficiently higher than a reflow temperature of a solder used for a solder connection.

As seen from the above, the electrode structure in accordance with the present invention is characterized in that a bump electrode is composed of a bump electrode portion and a pad electrode portion adjacent to the bump electrode portion, the bump electrode having a sufficient height as compared with the pad electrode portion and being formed of a metal having a solidifying or softening temperature sufficiently higher than a reflow temperature of a solder used for a solder connection. With this arrangement, in the process of solder-connecting by a reflow of a printed solder paste, it is possible to avoid inconveniences such as a short-circuiting caused by a reflowed solder, since a solder paste pressed out from a parts supporting electrode will climbs up along a side surface of the bump electrode to the pad electrode portion. Therefore, it is also possible to reduce the electrode pitch. For example, it is possible to realize a package having a narrow electrode pitch of not greater than 1 mm, for example, of 0.8 mm or 0.65 mm. This is very effective in increasing the number of electrodes.

In addition, according to the present invention, after completion of the solder connection, the solder connection is realized in such a condition that the bump electrode portion has been fitted in the solidified solder, since the solder paste pressed out from the parts supporting electrode has climbed up along a side surface of the bump electrode to the pad electrode portion. Accordingly, the strength of the solder connection is elevated, and the connection reliability is remarkably increased. In particular, when a bump electrode structure is composed of a bump electrode portion surrounded by a pad electrode portion having a thickness sufficiently smaller than the height of the bump electrode portion, it is possible to reduce the amount of solder paste swollen out of the contour of a parts supporting electrode, so that possibility of a short-circuiting caused by the reflowed solder can be minimized, and therefore, the connection reliability can be greatly improved.

According to the present invention, the bump electrode portion adjacent to or surrounded by the pad electrode portion can be formed by selectively forming a thick metal layer by an electroplating. Therefore, it is possible to easily form the bump electrode portion of a metal having a solidifying or softening temperature sufficiently higher than a reflow temperature of a solder used for a solder connection. In addition, it is also possible to minimize variation of the height of the bumps.

The invention has thus been shown and described with reference to the specific embodiments. However, it should be noted that the present invention is in no way limited to the details of the illustrated structures but changes and modifications may be made within the scope of the appended claims.

What is claimed is:

1. A connection electrode structure comprising:

a wiring conductor layer formed on a printed wiring board;

a rigid bump electrode portion having a substantial height formed on an outer end portion of said wiring conductor layer, said bump electrode portion being formed of a metal having a solidifying or softening temperature sufficiently higher than a reflow temperature of solder used for connecting said bump electrode portion with another electrode;

a coating metal layer covering said bump electrode portion and having a solder wettability;

a pad electrode portion formed adjacent to and continuous with said bump electrode portion, said pad electrode portion being integrally formed with said wiring conductor layer and formed of a portion of said wiring conductor layer, said pad electrode portion having a solder wettability and being in an uncovered condition; and an insulating layer formed on a portion of said wiring conductor layer towards an inner end portion of said wiring conductor layer with at least one portion of said pad electrode portion being positioned in said uncovered condition between said bump electrode portion and said insulating layer, so that when said bump electrode portion is bonded and connected to said another electrode with said solder by the reflow of said solder, an excessive part of said solder pressed out from an interface between said bump electrode portion and said another electrode climbs up along a side surface of said bump electrode portion to said pad electrode portion by action of said solder wettability, but is blocked by said insulating layer.

2. A connection electrode structure claimed in claim 1 wherein said pad electrode portion completely surrounds said bump electrode portion, and continues to said wiring conductor layer.

3. A connection electrode structure claimed in claim 1 wherein said insulating layer is formed of a solder resist.

4. A connection electrode structure as claimed in claim 1 wherein said bump electrode portion is an electroplated metal layer.

5. A connection electrode structure claimed in claim 4 wherein said bump electrode portion has a height of not less than 30 $\mu$m.

6. A connection electrode structure claimed in claim 1 wherein said bump electrode portion is formed of an electroplated Cu layer and said coating metal layer is formed of an Ni/Au conducting layer.

7. A connection electrode structure claimed in claim 6 wherein said bump electrode portion has a height of not less than 30 $\mu$m.

* * * * *